(12) United States Patent
Chen et al.

(10) Patent No.: US 11,380,389 B2
(45) Date of Patent: Jul. 5, 2022

(54) 8T DUAL PORT SRAM AND A MANUFACTURING METHOD THEREOF

(71) Applicant: Shanghai Huali Integrated Circuit Corporation, Shanghai (CN)

(72) Inventors: Pinhan Chen, Shanghai (CN); Yulin Wang, Shanghai (CN); Bangwei Shen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 17/224,386

(22) Filed: Apr. 7, 2021

(65) Prior Publication Data
US 2021/0366537 A1    Nov. 25, 2021

(30) Foreign Application Priority Data
May 25, 2020   (CN) .......................... 202010450665.8

(51) Int. Cl.
*G11C 11/412* (2006.01)
*G11C 11/419* (2006.01)
*H01L 27/11* (2006.01)

(52) U.S. Cl.
CPC .......... *G11C 11/419* (2013.01); *G11C 11/412* (2013.01); *H01L 27/1104* (2013.01); *H01L 27/1116* (2013.01)

(58) Field of Classification Search
CPC ....... G11C 11/419; G11C 11/412; G11C 8/16; G11C 11/413; G11C 11/416; H01L 27/1104; H01L 27/1116; H01L 27/0207

USPC .................................................... 365/63, 205
See application file for complete search history.

(56) References Cited

U.S. PATENT DOCUMENTS

| | | | | |
|---|---|---|---|---|
| 5,572,480 A | * | 11/1996 | Ikeda ...................... | H01L 27/11 257/385 |
| 5,821,787 A | * | 10/1998 | McClintock ......... | H03K 17/223 327/143 |
| 6,414,524 B1 | * | 7/2002 | Chen ..................... | H03K 17/164 327/170 |
| 10,355,671 B1 | * | 7/2019 | Mao .................... | H03K 3/35625 |
| 2004/0071010 A1 | * | 4/2004 | Wei ........................ | G11C 11/419 365/154 |
| 2005/0045919 A1 | * | 3/2005 | Kaeriyama ........... | H01L 45/085 257/E27.098 |
| 2005/0201141 A1 | * | 9/2005 | Turner .................. | G11C 11/405 365/149 |
| 2011/0026308 A1 | * | 2/2011 | Liaw ..................... | G11C 11/412 365/230.05 |

(Continued)

*Primary Examiner* — Michael T Tran
(74) *Attorney, Agent, or Firm* — Banner & Witcoff, Ltd.

(57) ABSTRACT

The memory comprises a first pass gate transistor, a second pass gate transistor, a third pass gate transistor, and a fourth pass gate transistor. On-resistance of the second pass gate transistor is smaller than that of the first pass gate transistor, so that first read current flowing from a first read/write port of a first group of read/write dual ports is equal to second read current flowing from a second read/write port of the first group of read/write dual port. On-resistance of the fourth pass gate transistor is smaller than that of the third pass gate transistor, so that third read current flowing from a first read/write port of a second group of read/write dual ports is equal to fourth read current flowing from a second read/write port of the second group of read/write dual port.

13 Claims, 5 Drawing Sheets

---

```
┌──────────────────────────────────────────────────┐  ╭─ 501
│  generating a circuit structure of the field effect │
│  transistors of the 8T DP-SRAM on a substrate    │
└──────────────────────────────────────────────────┘
```

```
┌──────────────────────────────────────────────────┐  ╭─ 502
│ performing different ion implantation on the first │
│ pass gate transistor, the second pass gate transistor, │
│ the third pass gate transistor, and the fourth pass │
│              gate transistor                     │
└──────────────────────────────────────────────────┘
```

(56) References Cited

U.S. PATENT DOCUMENTS

| | | | |
|---|---|---|---|
| 2013/0170275 A1* | 7/2013 | Kumar | H01L 27/1104 365/63 |
| 2013/0242677 A1* | 9/2013 | Iyer | G11C 11/412 365/189.16 |
| 2014/0185364 A1* | 7/2014 | Iyer | G11C 11/412 365/154 |
| 2017/0264298 A1* | 9/2017 | Yamada | H03K 19/185 |
| 2019/0341121 A1* | 11/2019 | Chen | G11C 29/50 |
| 2021/0366537 A1* | 11/2021 | Chen | G11C 11/419 |

\* cited by examiner

8T DUAL PORT SRAM AND A MANUFACTURING METHOD THEREOF

CROSS-REFERENCES TO RELATED APPLICATIONS

This application claims priority to Chinese patent application No. 202010450665.8, filed on May 25, 2020, the disclosure of which is incorporated herein by reference in entirety.

TECHNICAL FIELD

The present invention relates to a manufacturing process of a memory device, in particular to an eight-transistor dual port static random access memory (8T DP-SRAM), and a method for manufacturing the 8T dual port SRAM.

BACKGROUND OF THE DISCLOSURE

In foundry field of semiconductor digital logic chips, SRAM is often used as a storage tool. A dual port SRAM composed of eight transistor (8T) has two groups of read/write dual ports. Both read/write ports of each group of read/write dual ports can provide functions of reading and writing data.

In the existing 8T dual port SRAM, transistors with same size are usually used as pass gates for each read/write port. Generally, these transistors with same size have same or similar electrical parameters, which are used to keep the read/write ports of the 8T dual port SRAM consistent with each other.

However, in practical application of the 8T dual port SRAM, due to an asymmetrical layout structure of each transistor element in the SRAM, forward read current, flowing from a first read/write port of each group of read/write dual ports, and reverse read current, flowing from a second read/write port of the same group of read/write dual ports, generally have inconsistent current values. The reverse read current with a smaller current value will lead to a slower speed when performing data read operations through the second read/write port, thereby causing a problem of asymmetric performance of the read/write ports of the 8T dual port SRAM.

In order to overcome the above-mentioned shortcomings in the prior art, there is an urgent need in the art for a manufacturing process of an 8T dual port SRAM to compensate for the asymmetric performance of each read/write port caused by an asymmetric layout architecture of the transistors, which may improve the performance of ports with low current and slow speed by increasing the current and speed of the corresponding ports.

BRIEF SUMMARY OF THE DISCLOSURE

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to overcome the above-mentioned shortcomings in the prior art, the present invention provides an eight-transistor dual port static random access memory (8T DP-SRAM), a method for manufacturing the 8T dual port SRAM, and a computer-readable storage medium, used to compensate for the asymmetric performance of each read/write port caused by asymmetric layout architecture of the transistors. By increasing the current and speed of ports with low current and slow speed, the 8T dual port SRAM and the manufacturing method thereof provided by the present invention can effectively increase the reading speed of the corresponding ports.

The eight-transistor dual port SRAM provided by the present invention comprises a first pass gate transistor, a second pass gate transistor, a third pass gate transistor, a fourth pass gate transistor, a first pull-up transistor, a second pull-up transistor, a first pull-down transistor, and a second pull-down transistor.

A drain of the first pass gate transistor is used as a first read/write port of a first group of read/write dual ports of the SRAM. A gate of the first pass gate transistor is configured to connect a first word line. A source of the first pass gate transistor is connected to an internal node of the SRAM. A drain of the second pass gate transistor is used as a second read/write port of the first group of read/write dual ports. A gate of the second pass gate transistor is configured to connect the first word line. A source of the second pass gate transistor is connected to an inverting internal node of the SRAM. A drain of the third pass gate transistor is used as a first read/write port of a second group of read/write dual ports of the SRAM. A gate of the third pass gate transistor is configured to connect a second word line. A source of the third pass gate transistor is connected to the inverting internal node. A drain of the fourth pass gate transistor is used as a second read/write port of the second group of read/write dual ports. A gate of the fourth pass gate transistor is configured to connect the second word line. A source of the fourth pass gate transistor is connected to the internal node of the SRAM.

A source of the first pull-up transistor is configured to connect a high level voltage. A drain of the first pull-up transistor is connected to the internal node. A gate of the first pull-up transistor is connected to the inverting internal node. A source of the second pull-up transistor is configured to connect a high level voltage. A drain of the second pull-up transistor is connected to the inverting internal node. A gate of the second pull-up transistor is connected to the internal node. A source of the first pull-down transistor is configured to connect a low level voltage. A drain of the first pull-down transistor is connected to the internal node. A gate of the first pull-down transistor is connected to the inverting internal node. A source of the second pull-down transistor is configured to connect a low level voltage. A drain of the second pull-down transistor is connected to the inverting internal node. A gate of the second pull-down transistor is connected to the internal node.

On-resistance of the second pass gate transistor is smaller than that of the first pass gate transistor, so that first read current flowing from the first read/write port of the first group of read/write dual ports is equal to second read current flowing from the second read/write port of the first group of read/write dual port. On-resistance of the fourth pass gate transistor is smaller than that of the third pass gate transistor, so that third read current flowing from the first read/write port of the second group of read/write dual ports is equal to fourth read current flowing from the second read/write port of the second group of read/write dual port.

In some embodiments of the present invention, the first read current may flow through a first end of the internal node from the first read/write port of the first group of read/write dual ports, and flow out of the SRAM from the first pull-down transistor to read data stored in the internal node. A gate of the first pull-down transistor is connected to the first end of the internal node. The second read current may flow into a first end of the inverting internal node from the second read/write port of the first group of read/write dual ports, and flow out of the SRAM from a second end of the inverting internal node, through the second pull-down transistor, to read data stored in the inverting internal node. A gate of the second pull-down transistor is connected to the second end of the inverting internal node. The third read current may flow through the second end of the inverting internal node from the first read/write port of the second group of read/write dual ports, and flow out of the SRAM from the second pull-down transistor to read the data stored in the inverting internal node. The fourth read current may flow into a second end of the internal node from the second read/write port of the second group of read/write dual ports, and flow out of the SRAM from the first end of the internal node, through the first pull-down transistor, to read the data stored in the internal node.

In some embodiments of the present invention, the difference between the on-resistance of the first pass gate transistor and the on-resistance of the second pass gate transistor is equal to an impedance from the source of the second pass gate transistor to the second end of the inverting internal node. The difference between the on-resistance of the third pass gate transistor and the on-resistance of the fourth pass gate transistor is equal to an impedance from the source of the fourth pass gate transistor to the first end of the internal node.

In some embodiments of the present invention, the first pass gate transistor, the third pass gate transistor, the first pull-down transistor, and the second pull-down transistor may be ion implanted by a basic lightly doped drain implanting process and a basic pocket implanting process. The second pass gate transistor and the fourth pass gate transistor may be ion implanted by a further performed heavy lightly doped drain implanting process on basis of the basic lightly doped drain implanting process and the basic pocket implanting process.

In some embodiments of the present invention, the first pass gate transistor, the third pass gate transistor, the first pull-down transistor, and the second pull-down transistor may be ion implanted by a basic lightly doped drain implanting process and a basic pocket implanting process. The second pass gate transistor and the fourth pass gate transistor may be ion implanted by a heavy lightly doped drain implanting process and a light pocket implanting process.

According to another aspect of the present invention, a method for manufacturing the eight-transistor dual port SRAM is also provided herein.

The method for manufacturing an eight-transistor dual port SRAM provided by the present invention comprises steps:

generating a circuit structure of the SRAM on a substrate, wherein the circuit structure comprises: a first pass gate transistor, wherein a drain of the first pass gate transistor is used as a first read/write port of a first group of read/write dual ports of the SRAM, a gate of the first pass gate transistor is configured to connect a first word line, and a source of the first pass gate transistor is connected to an internal node of the SRAM; a second pass gate transistor, wherein a drain of the second pass gate transistor is used as a second read/write port of the first group of read/write dual ports, a gate of the second pass gate transistor is configured to connect the first word line, and a source of the second pass gate transistor is connected to an inverting internal node of the SRAM; a third pass gate transistor, wherein a drain of the third pass gate transistor is used as a first read/write port of a second group of read/write dual ports of the SRAM, a gate of the third pass gate transistor is configured to connect a second word line, and a source of the third pass gate transistor is connected to the inverting internal node; a fourth pass gate transistor, wherein a drain of the fourth pass gate transistor is used as a second read/write port of the second group of read/write dual ports, a gate of the fourth pass gate transistor is configured to connect the second word line, and a source of the fourth pass gate transistor is connected to the internal node of the SRAM; a first pull-up transistor, wherein a source of the first pull-up transistor is configured to connect a high level voltage, a drain of the first pull-up transistor is connected to the internal node, and a gate of the first pull-up transistor is connected to the inverting internal node; a second pull-up transistor, wherein a source of the second pull-up transistor is configured to connect a high level voltage, a drain of the second pull-up transistor is connected to the inverting internal node, and a gate of the second pull-up transistor is connected to the internal node; a first pull-down transistor, wherein a source of the first pull-down transistor is configured to connect a low level voltage, a drain of the first pull-down transistor is connected to the internal node, and a gate of the first pull-down transistor is connected to the inverting internal node; and a second pull-down transistor, wherein a source of the second pull-down transistor is configured to connect a low level voltage, a drain of the second pull-down transistor is connected to the inverting internal node, and a gate of the second pull-down transistor is connected to the internal node; and performing ion implantation on the first pass gate transistor, the second pass gate transistor, the third pass gate transistor, and the fourth pass gate transistor, making on-resistance of the second pass gate transistor smaller than that of the first pass gate transistor, so that first read current flowing from the first read/write port of the first group of read/write dual ports is equal to second read current flowing from the second read/write port of the first group of read/write dual port, and making on-resistance of the fourth pass gate transistor smaller than that of the third pass gate transistor, so that third read current flowing from the first read/write port of the second group of read/write dual ports is equal to fourth read current flowing from the second read/write port of the second group of read/write dual port.

In some embodiments of the present invention, the first read current may flow through a first end of the internal node from the first read/write port of the first group of read/write dual ports, and flow out of the SRAM from the first pull-down transistor to read data stored in the internal node. The second read current may flow into a first end of the inverting internal node from the second read/write port of the first group of read/write dual ports, and flow out of the SRAM from a second end of the inverting internal node, through the second pull-down transistor, to read data stored in the inverting internal node. The third read current may flow through the second end of the inverting internal node from the first read/write port of the second group of read/write dual ports, and flow out of the SRAM from the second pull-down transistor to read the data stored in the inverting internal node. The fourth read current may flow into a second end of the internal node from the second read/write port of the second group of read/write dual ports, and flow out of the SRAM from the first end of the internal node, through the first pull-down transistor, to read the data stored in the internal node.

In some embodiments of the present invention, the step of performing ion implantation may comprise: performing different ion implantation on the first pass gate transistor and the second pass gate transistor to make difference between the on-resistance of the first pass gate transistor and the on-resistance of the second pass gate transistor equal to an impedance from the source of the second pass gate transistor to the second end of the inverting internal node; and performing different ion implantation on the third pass gate transistor and the fourth pass gate transistor to make difference between the on-resistance of the third pass gate transistor and the on-resistance of the fourth pass gate transistor equal to an impedance from the source of the fourth pass gate transistor to the first end of the internal node.

In some embodiments of the present invention, the step of performing ion implantation may comprise: performing a basic lightly doped drain implanting process and a basic pocket implanting process on the first pass gate transistor, the second pass gate transistor, the third pass gate transistor, the fourth pass gate transistor, a first pull-down transistor of the SRAM, and a second pull-down transistor of the SRAM; and further performing a heavy lightly doped drain implanting process on the second pass gate transistor and the fourth pass gate transistor that have been performed with the basic lightly doped drain implanting process and the basic pocket implanting process.

In some embodiments of the present invention, the step of performing the basic lightly doped drain implanting process and the basic pocket implanting process may further comprise: covering an original implanting mask on the first pass gate transistor, the second pass gate transistor, the third pass gate transistor, the fourth pass gate transistor, the first pull-down transistor and the second pull-down transistor to perform the basic lightly doped drain implanting process and the basic pocket implanting process. The step of performing the heavy lightly doped drain implanting process may further comprise: after completing the basic lightly doped drain implanting process and the basic pocket implanting process, covering an extra implanting mask on the second pass gate transistor and the fourth pass gate transistor to perform the heavy lightly doped drain implanting process.

In some embodiments of the present invention, the step of performing ion implantation may comprise: performing a basic lightly doped drain implanting process and a basic pocket implanting process on the first pass gate transistor, the third pass gate transistor, a first pull-down transistor of the SRAM and a second pull-down transistor of the SRAM; and performing a heavy lightly doped drain implanting process and a light pocket implanting process on the second pass gate transistor and the fourth pass gate transistor.

In some embodiments of the present invention, the step of performing the basic lightly doped drain implanting process and the basic pocket implanting process may further comprise: covering a first implanting mask on the first pass gate transistor, the third pass gate transistor, the first pull-down transistor and the second pull-down transistor to perform the basic lightly doped drain implanting process and the basic pocket implanting process. The step of performing the heavy lightly doped drain implanting process and the light pocket implanting process may further comprise: covering a second implanting mask on the second pass gate transistor and the fourth pass gate transistor to perform the heavy lightly doped drain implanting process and the light pocket implanting process.

According to another aspect of the present invention, a computer-readable storage medium is also provided herein.

The computer-readable storage medium has computer instructions stored thereon. When the computer instructions are executed by a processor, a method for manufacturing an eight-transistor dual port SRAM, provided by any one of the above embodiments, can be implemented to compensate for the asymmetric performance of each read/write port caused by an asymmetric layout architecture of the transistors, thereby improving the performance of ports with low current and slow speed by increasing the current and speed of the corresponding ports.

BRIEF DESCRIPTION OF THE SEVERAL VIEWS OF THE DRAWINGS

The above features and advantages of the present invention will be better understood after reading the detailed description of the embodiments of the present disclosure in conjunction with the following figures. In the figures, components are not necessarily drawn to scale, and components having similar related features may have the same or similar reference numerals.

DETAILED DESCRIPTION OF THE DISCLOSURE

The embodiments of the present invention are described in the following detailed description. Other advantages and effects of the present invention will be readily apparent to those skilled in the art from this disclosure. Although the description of the present invention will be described in conjunction with the preferred embodiments, this is not a limitation of the present invention. On the contrary, the invention is described in connection with the embodiments so as to cover other alternatives or modifications that are possible in the embodiments of the present invention. In order to provide a thorough understanding of the present invention, many specific details are included in the following description. The present invention may also be practiced without these details. In addition, some specific details are omitted in the description in order to avoid confusing or obscuring the present invention.

In the description of the present invention, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components. The specific meaning of the above terms in the present invention can be understood in a specific case by those skilled in the art.

Understandably, although the terms "first", "second", "third", etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present invention.

In order to overcome the above-mentioned shortcomings in the prior art, the present invention provides an eight-transistor dual port static random access memory (8T DP-SRAM), a method for manufacturing the 8T dual port SRAM, and a computer-readable storage medium, used to compensate for the asymmetric performance of each read/write port caused by asymmetric layout architecture of the transistors.

Figure 1:
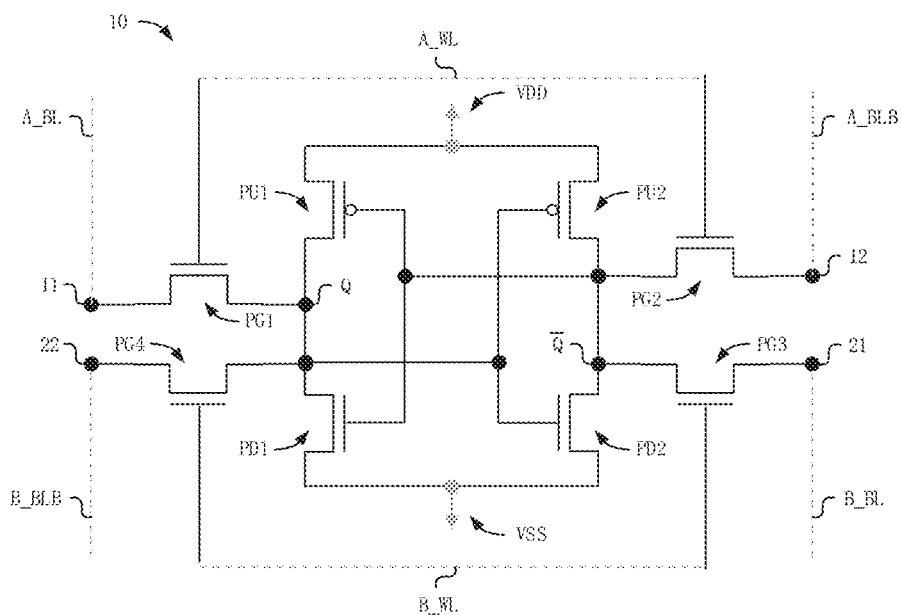
FIG. 1 shows a schematic diagram of a circuit structure of the 8T dual port SRAM according to an aspect of the present invention.

Referring to FIG. 1, FIG. 1 shows a schematic diagram of a circuit structure of the 8T dual port SRAM according to an aspect of the present invention.

As shown in FIG. 1, the 8T DP-SRAM 10 provided by the present invention comprises a first pass gate transistor PG1, a second pass gate transistor PG2, a third pass gate transistor PG3, a fourth pass gate transistor PG4, a first pull-up transistor PU1, a second pull-up transistor PU2, a first pull-down transistor PD1, and a second pull-down transistor PD2.

In some embodiments, a drain of the first pass gate transistor PG1 may be used as a first read/write port 11 of a first group of read/write dual ports of the SRAM 10, which may be connected to an external first bit line A_BL for an external processor to read data from an internal node Q or write data into the internal node Q. A gate of the first pass gate transistor PG1 is configured to connect a first word line A_WL, so that on/off of the first pass gate transistor PG1 is controlled according to a potential of the first word line A_WL. A source of the first pass gate transistor PG1 is connected to the internal node Q of the SRAM 10, used to lead out the internal node Q for data reading or data writing.

In some embodiments, a drain of the second pass gate transistor PG2 is used as a second read/write port 12 of the first group of read/write dual ports, which may be connected to an external second bit line A_BLB for an external processor to read data from an inverting internal node $\overline{Q}$ or write data into the inverting internal node $\overline{Q}$. A gate of the second pass gate transistor PG2 is configured to connect the first word line A_WL, so that on/off of the second pass gate transistor PG2 is controlled according to the potential of the first word line A_WL. A source of the second pass gate transistor PG2 is connected to the inverting internal node $\overline{Q}$ of the SRAM 10, used to lead out the inverting internal node $\overline{Q}$ for data reading or data writing.

In some embodiments, the first pass gate transistor PG1 and the second pass gate transistor PG2 are controlled by the same word line A_WL to be turned on or turned off synchronously, so that the first read/write port 11 and the second read/write port 12 form a group of read/write dual ports for data reading or data writing.

In some embodiments, a drain of the third pass gate transistor PG3 is used as a first read/write port 21 of a second group of read/write dual ports of the SRAM 10, which may be connected to an external third bit line B_BL for an external processor to read data from the inverting internal node $\overline{Q}$ or write data into the inverting internal node $\overline{Q}$. A gate of the third pass gate transistor PG3 is configured to connect a second word line B_WL, so that on/off of the third pass gate transistor PG3 is controlled according to a potential of the second word line B_WL. A source of the third pass gate transistor PG3 is connected to the inverting internal node $\overline{Q}$, used to lead out the inverting internal node $\overline{Q}$ for data reading or data writing.

In some embodiments, a drain of the fourth pass gate transistor PG4 is used as a second read/write port 22 of the second group of read/write dual ports, which may be connected to an external fourth bit line B_BLB for an external processor to read data from the internal node Q or write data into the internal node Q. A gate of the fourth pass gate transistor PG4 is configured to connect the second word line B_WL, so that on/off of the fourth pass gate transistor PG4 is controlled according to the potential of the second word line B_WL. A source of the fourth pass gate transistor PG4 is connected to the internal node Q of the SRAM 10, used to lead out the internal node Q for data reading or data writing.

In some embodiments, a source of the first pull-up transistor PU1 is configured to connect a high-level internal working voltage VDD of a device. A drain of the first pull-up transistor PU1 is connected to the internal node Q. A gate of the first pull-up transistor PU1 is connected to the inverting internal node Q. In response to the second bit line A_BLB or the third bit line B_BL writing low-level data 0 into the inverting internal node $\overline{Q}$, the first pull-up transistor PU1 will be turned on and pull up the voltage level of the internal node Q to high-level data 1.

In some embodiments, a source of the second pull-up transistor PU2 is configured to connect a high-level internal working voltage VDD of a device. A drain of the second pull-up transistor PU2 is connected to the inverting internal node $\overline{Q}$. A gate of the second pull-up transistor PU2 is connected to the internal node Q. In response to the first bit line A_BL or the fourth bit line B_BLB writing low-level data 0 into the internal node Q, the second pull-up transistor PU2 will be turned on and pull up the voltage level of the inverting internal node $\overline{Q}$ to high-level data 1.

In some embodiments, a source of the first pull-down transistor PD1 is configured to connect a low-level common grounded voltage VSS. A drain of the first pull-down transistor PD1 is connected to the internal node Q. A gate of the first pull-down transistor is connected to the inverting internal node $\overline{Q}$. In response to the second bit line A_BLB or the third bit line B_BL writing high-level data 1 into the inverting internal node $\overline{Q}$, the first pull-down transistor PD1 will be turned on and pull down the voltage level of the internal node Q to low-level data 0.

In some embodiments, a source of the second pull-down transistor PD2 is configured to connect a low-level common grounded voltage VSS. A drain of the second pull-down transistor PD2 is connected to the inverting internal node $\overline{Q}$. A gate of the second pull-down transistor PD2 is connected to the internal node Q. In response to the first bit line A_BL or the fourth bit line B_BLB writing high-level data 1 into the internal node Q, the second pull-down transistor PD2 will be turned on and pull down the voltage level of the inverting internal node $\overline{Q}$ to low-level data 0.

In some embodiments, the first pass gate transistor PG1, the second pass gate transistor PG2, the third pass gate transistor PG3, the fourth pass gate transistor PG4, the first pull-down transistor PD1, and the second pull-down transistor PD2 may be N type field effect transistors (N-FET). In some embodiments, the first pull-up transistor PU1 and the second pull-up transistor PU2 may be P type field effect transistors (P-FET).

Figure 2:
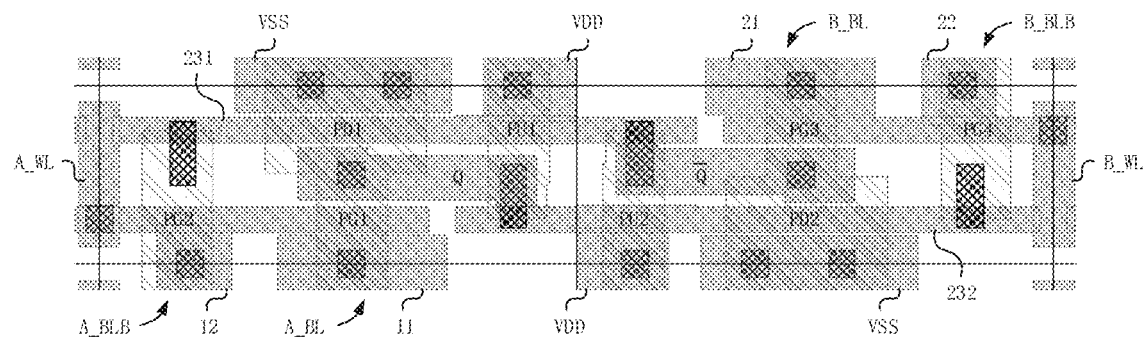
FIG. 2 shows a schematic diagram of a layout architecture of transistors of the 8T dual port SRAM according to some embodiments of the present invention.

Referring to FIG. 2, FIG. 2 shows a schematic diagram of a layout architecture of transistors of the 8T dual port SRAM according to some embodiments of the present invention.

As shown in FIG. 2, in some embodiments of the present invention, the internal node Q and the inverting internal node $\overline{Q}$ of the 8T DP-SRAM 10 may be long metal wires. A first end of the internal node Q is connected to the source of the first pass gate transistor PG1 and the drain of the first pull-down transistor PD1, and a second end is connected to the drain of the first pull-up transistor PU1. A first end of the inverting internal node $\overline{Q}$ is connected to the drain of the second pull-up transistor PU2, and a second terminal is connected to the source of the third pass gate transistor PG3 and the drain of the second pull-down transistor PD2. In some embodiments, the source of the second pass gate transistor PG2 may be connected to the first end of the inverting internal node $\overline{Q}$ through a long strip of polysilicon (Poly) 231. In some embodiments, the source of the fourth pass gate transistor PG4 may be connected to the second end of the internal node Q through another long strip of polysilicon 232.

Figure 3A:
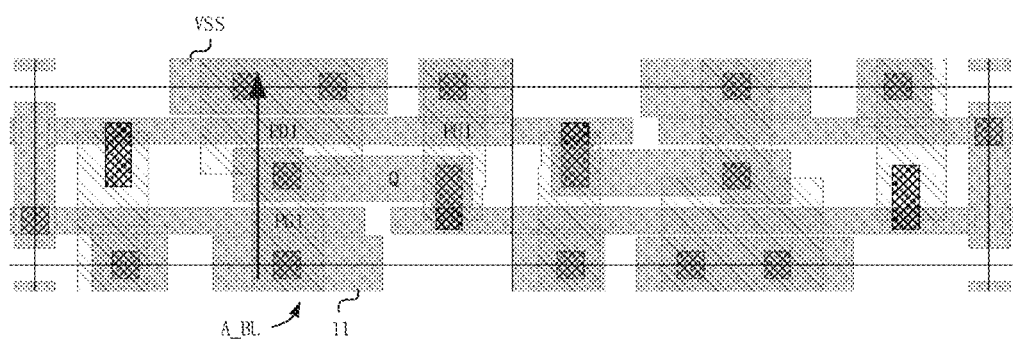
FIGS. 3A-3D show schematic diagrams of paths of first read current, second read current, third read current, and fourth read current according to some embodiments of the present invention.
Figure 4A:
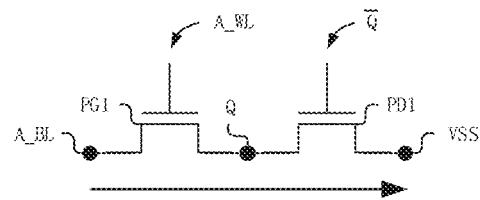
FIGS. 4A-4D show schematic circuit diagrams of paths of the first read current, the second read current, the third read current, and the fourth read current according to some embodiments of the present invention.

Referring to FIG. 3A and FIG. 4A, FIG. 3A shows a schematic diagram of the path of first read current according to some embodiments of the present invention, and FIG. 4A shows a schematic circuit diagram of the path of the first read current according to some embodiments of the present invention.

As shown in FIG. 3A, in some embodiments, when data stored in the internal node Q needs to be read from the first read/write port 11 of the first group of read/write dual ports, the processor may input first read current to the first read/write port 11 through the first bit line A_BL. The first read current will flow through the first end of the internal node Q, and flow out of the SRAM 10 from the source of the first pull-down transistor PD1 through the drain of the first pull-down transistor PD1. The processor may determine whether the data stored in the internal node Q is a high-level 1 or a low-level 0 according to the value of the first read current.

As shown in FIG. 4A, in the above embodiment, the first read current successively flows through the drain and the source of the first pass gate transistor PG1, and the drain and the source of the first pull-down transistor PD1 in the 8T DP-SRAM 10. Therefore, an equivalent circuit of the path of the first read current comprises on-resistance of the first pass gate transistor PG1 and on-resistance of the first pull-down transistor PD1.

Figure 3B:
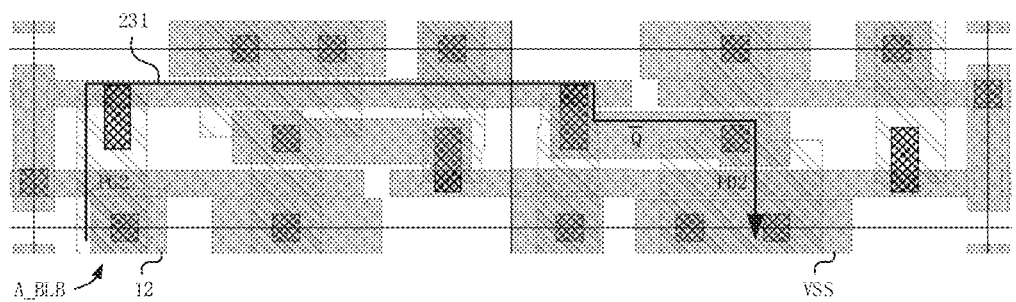
Figure 4B:
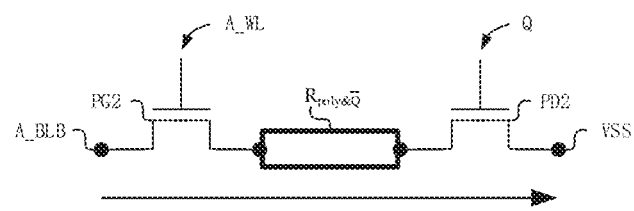

Referring to FIG. 3B and FIG. 4B, FIG. 3B shows a schematic diagram of the path of second read current according to some embodiments of the present invention, and FIG. 4B shows a schematic circuit diagram of the path of the second read current according to some embodiments of the present invention.

As shown in FIG. 3B, in some embodiments, when data stored in the inverting internal node $\overline{Q}$ needs to be read from the second read/write port 12 of the first group of read/write dual ports, the processor may input second read current to the second read/write port 12 through the second bit line A_BLB. The second read current will flow into the first end of the inverting internal node $\overline{Q}$ through the polysilicon 231, flow into the drain of the second pull-down transistor PD2 from the second end of the inverting internal node $\overline{Q}$, and flow out of the SRAM 10 from the source of the second pull-down transistor PD2. The processor may determine whether the data stored in the inverting internal node $\overline{Q}$ is a high-level 1 or a low-level 0 according to the value of the second read current.

As shown in FIG. 4B, in the above embodiment, the second read current successively flows through the drain and the source of the second pass gate transistor PG2, both ends of the polysilicon 231, both ends of the inverting internal node $\overline{Q}$, and the drain and the source of the second pull-down transistor PD2 in the 8T DP-SRAM 10. Therefore, an equivalent circuit of the path of the second read current comprises on-resistance of the second pass gate transistor PG2, equivalent resistance of the polysilicon 231, equivalent resistance of the inverting internal node $\overline{Q}$, and on-resistance of the second pull-down transistor PD2.

It can be seen that when reading data through the second read/write port 12 of the first group of read/write dual ports, if the on-resistance of the second pass gate transistor PG2 is equal to the on-resistance of the first pass gate transistor PG1, the impedance on the path of the second read current will be greater than that of the first read current, which is input from the first read/write port 11. Therefore, under conditions of outputting same read voltage, the speed of a processor, reading data through the second read/write port 12 of the first group of read/write dual ports of an existing SRAM, will be slower than that through the first read/write port 11 of the first group of read/write dual ports. As a result, the performance of the first group of read/write dual ports 11, 12 of the 8T DP-SRAM 10 is asymmetry. Conversely, by making the on-resistance of the second pass gate transistor PG2 smaller than the on-resistance of the first pass gate transistor PG1, the present invention can make the first read current, flowing from the first read/write port 11 of the first group of read/write dual ports, equal to the second read current, flowing from the second read/write port 12 of the first group of read/write dual ports, thereby ensuring a symmetry performance of the first group of read/write dual ports 11, 12 of the 8T DP-SRAM 10.

Figure 3C:
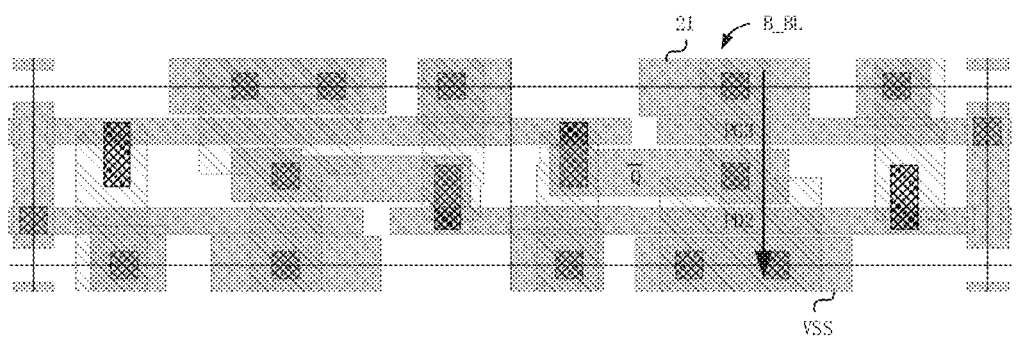
Figure 4C:
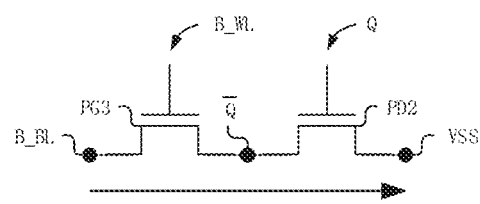

Referring to FIG. 3C and FIG. 4C, FIG. 3C shows a schematic diagram of the path of third read current according to some embodiments of the present invention, and FIG. 4C shows a schematic circuit diagram of the path of the third read current according to some embodiments of the present invention.

As shown in FIG. 3C, in some embodiments, when data stored in the inverting internal node $\overline{Q}$ needs to be read from the first read/write port 21 of the second group of read/write dual ports, the processor may input third read current to the first read/write port 21 through the third bit line B_BL. The third read current will flow through the second end of the inverting internal node $\overline{Q}$, and flow out of the SRAM 10 from the source of the second pull-down transistor PD2 through the drain of the second pull-down transistor PD2. The processor may determine whether the data stored in the inverting internal node $\overline{Q}$ is a high-level 1 or a low-level 0 according to the value of the third read current.

As shown in FIG. 4C, in the above embodiment, the third read current successively flows through the drain and the source of the third pass gate transistor PG3, and the drain and the source of the second pull-down transistor PD2 in the 8T DP-SRAM 10. Therefore, an equivalent circuit of the path of the third read current comprises on-resistance of the third pass gate transistor PG3 and on-resistance of the second pull-down transistor PD2.

Figure 3D:
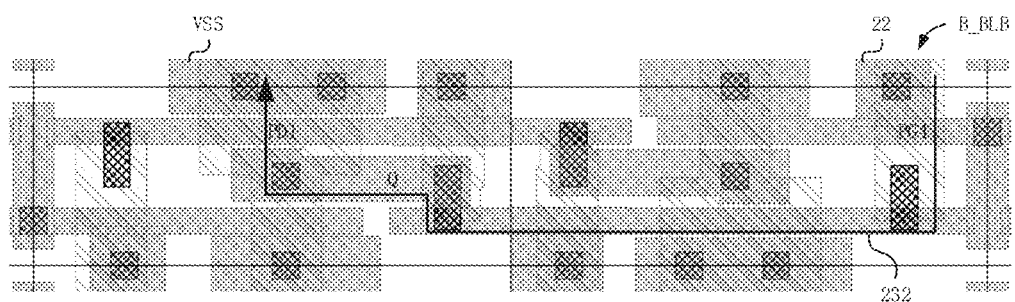
Figure 4D:
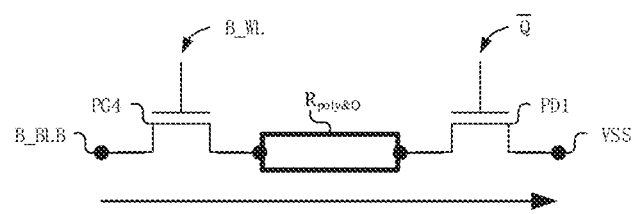

Referring to FIG. 3D and FIG. 4D, FIG. 3D shows a schematic diagram of the path of fourth read current according to some embodiments of the present invention, and FIG. 4D shows a schematic circuit diagram of the path of the fourth read current according to some embodiments of the present invention.

As shown in FIG. 3D, in some embodiments, when data stored in the internal node Q needs to be read from the second read/write port 22 of the second group of read/write dual ports, the processor may input fourth read current to the second read/write port 22 through the fourth bit line B_BLB. The fourth read current will flow into the second end of the internal node Q through the polysilicon 232, flow into the drain of the first pull-down transistor PD1 from the first end of the internal node Q, and flow out of the SRAM 10 from the source of the first pull-down transistor PD1. The processor may determine whether the data stored in the internal node Q is a high-level 1 or a low-level 0 according to the value of the fourth read current.

As shown in FIG. 4D, in the above embodiment, the fourth read current successively flows through the drain and the source of the fourth pass gate transistor PG4, both ends of the polysilicon 232, both ends of the internal node Q, and the drain and the source of the first pull-down transistor PD1 in the 8T DP-SRAM 10. Therefore, an equivalent circuit of the path of the fourth read current comprises on-resistance of the fourth pass gate transistor PG4, equivalent resistance of the polysilicon 232, equivalent resistance of the internal node Q, and on-resistance of the first pull-down transistor PD1.

It can be seen that when reading data through the second read/write port 22 of the second group of read/write dual ports, if the on-resistance of the fourth pass gate transistor PG4 is equal to the on-resistance of the third pass gate transistor PG3, the impedance on the path of the fourth read current will be greater than that of the third read current, which is input from the first read/write port 21. Therefore, under conditions of outputting same read voltage, the speed of a processor, reading data through the second read/write port 22 of the second group of read/write dual ports of an existing SRAM, will be slower than that through the first read/write port 21 of the second group of read/write dual ports. As a result, the performance of the second group of read/write dual ports 21, 22 of the 8T DP-SRAM 10 is asymmetry. Conversely, by making the on-resistance of the fourth pass gate transistor PG4 smaller than the on-resistance of the third pass gate transistor PG3, the present invention can make the third read current, flowing from the first read/write port 21 of the second group of read/write dual ports, equal to the fourth read current, flowing from the second read/write port 22 of the second group of read/write dual ports, thereby ensuring a symmetry performance of the second group of read/write dual ports 21, 22 of the 8T DP-SRAM 10.

In order to overcome the problem of asymmetric performance of the first group of read/write dual ports 11, 12 and the second group of read/write dual ports 21, 22 of the 8T DP-SRAM 10, the present invention provides a method for manufacturing an 8T DP-SRAM. By performing further ion implantation on the second pass gate transistor PG2 and the fourth pass gate transistor PG4 of the 8T DP-SRAM 10, the manufacturing method reduces the on-resistance of the second pass gate transistor PG2 and the fourth pass gate transistor PG4, thereby achieving a balance between the first read current and the second read current, and a balance between the third read current and the fourth read current.

Figure 5:
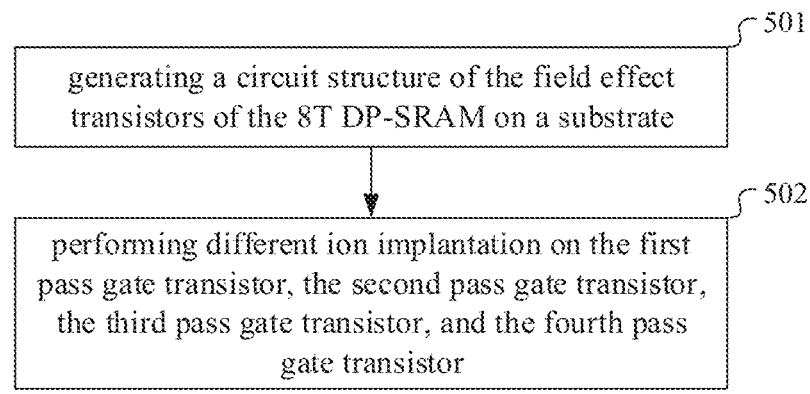
FIG. 5 shows a flow chart of a method for manufacturing an 8T dual port SRAM according to another aspect of the present invention.

Referring to FIG. 5, FIG. 5 shows a flow chart of a method for manufacturing an 8T dual port SRAM according to another aspect of the present invention.

As shown in FIG. 5, the method for manufacturing an 8T DP-SRAM provided by the present invention comprises steps:

501: generating a circuit structure of the field effect transistors of the 8T DP-SRAM on a substrate; and

502: performing different ion implantation on the first pass gate transistor, the second pass gate transistor, the third pass gate transistor, and the fourth pass gate transistor.

In some embodiments of the present invention, the ion implantation performed on the second pass gate transistor PG2 may be stronger than that performed on the first pass gate transistor PG1, so that the on-resistance of the second pass gate transistor PG2 will be smaller than that of the first pass gate transistor PG1. In some preferred embodiments, by quantitatively controlling the degree of ion implantation performed on the first pass gate transistor PG1 and the second pass gate transistor PG2, the difference between the on-resistance of the first pass gate transistor PG1 and the on-resistance of the second pass gate transistor PG2 may be made equal to a sum of the equivalent resistance of the polysilicon 231 and the equivalent resistance of the inverting internal node $\overline{Q}$. In other words, the difference between the on-resistance of the first pass gate transistor PG1 and that of the second pass gate transistor PG2 may be equal to the total impedance from the source of the second pass gate transistor PG2 to the second end of the inverting internal node $\overline{Q}$, thereby making the first read current, flowing from the first read/write port 11 of the first group of read/write dual ports, equal to the second read current, flowing from the second read/write port 12 of the first group of read/write dual ports.

Similarly, in some embodiments of the present invention, the ion implantation performed on the fourth pass gate transistor PG4 may be stronger than that performed on the third pass gate transistor PG3, so that the on-resistance of the fourth pass gate transistor PG4 is smaller than that of the third pass gate transistor PG3. In some preferred embodiments, by quantitatively controlling the degree of ion implantation performed on the third pass gate transistor PG3 and the fourth pass gate transistor PG4, the difference between the on-resistance of the third pass gate transistor PG3 and the on-resistance of the fourth pass gate transistor PG4 may be made equal to a sum of the equivalent resistance of the polysilicon 232 and the equivalent resistance of the internal node Q. In other words, the difference between the on-resistance of the third pass gate transistor PG3 and that of the fourth pass gate transistor PG4 may be equal to the total impedance from the source of the fourth pass gate transistor PG4 to the first end of the internal node Q, thereby making the third read current, flowing from the first read/write port 21 of the second group of read/write dual ports, equal to the fourth read current, flowing from the second read/write port 22 of the second group of read/write dual ports.

Figure 6A:
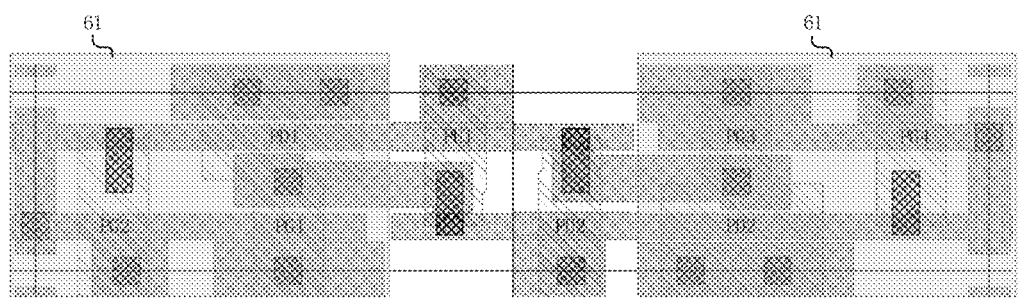
FIGS. 6A-6B show schematic diagrams of performing ion implantation according to some embodiments of the present invention.
Figure 6B:
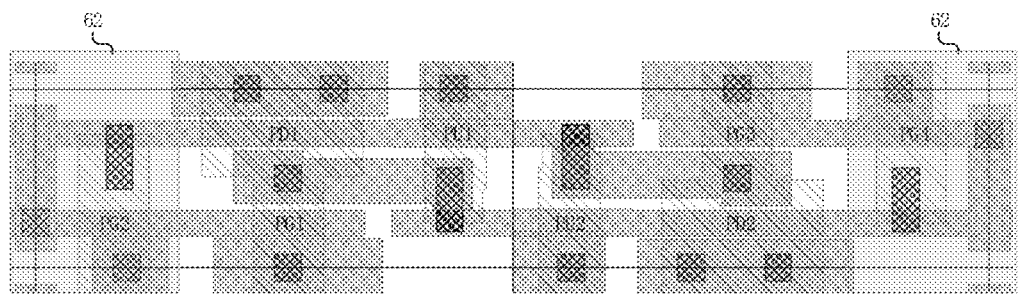

In some embodiments of the present invention, the process of ion implantation on the field effect transistors of the 8T DP-SRAM 10 may be performed in two steps. Referring to FIGS. 6A~6B, FIGS. 6A~6B show schematic diagrams of performing ion implantation according to some embodiments of the present invention.

As shown in FIG. 6A, in the above embodiment, when performing ion implantation on the field effect transistors of the 8T DP-SRAM 10, the first pass gate transistor PG1, the second pass gate transistor PG2, the third pass gate transistor PG3, the fourth pass gate transistor PG4, the first pull-down transistor PD1 and the second pull-down transistor PD2 may be firstly covered by an original ion implanting mask 61, for performing a basic lightly doped drain implanting (BSL LDD Imp.) process and a basic pocket implanting (BSL PKT Imp.) process on the covered field effect transistors. By performing the basic lightly doped drain implanting process, the electric field in the drain region of the field effect transistors may be effectively weakened, thereby improving the hot electron degradation effect. By performing the basic pocket implantation, punch-through between the source and drain of the field effect transistors may be effectively prevented, thereby suppressing the short (narrow) channel effect.

As shown in FIG. 6B, after completing the basic lightly doped drain implanting (BSL LDD Imp.) process and the basic pocket implanting (BSL PKT Imp.) process, an extra ion implanting mask 62 may be further used to cover the second pass gate transistor PG2 and the fourth pass gate transistor PG4, for further performing a heavy lightly doped drain implanting (Heavy LDD Imp.) process on the covered second pass gate transistor PG2 and fourth pass gate transistor PG4. By further performing the heavy lightly doped drain implanting process on the second pass gate transistor PG2 and the fourth pass gate transistor PG4 that have completed the basic lightly doped drain implanting process and the basic pocket implanting process, the second pass gate transistor PG2 and the fourth pass gate transistor PG4 may be further implanted with ions, thereby further reducing the on-resistance of the second pass gate transistor PG2 and the fourth pass gate transistor PG4.

In some preferred embodiments, the sum of the on-resistance of the second pass gate transistor PG2 that has been performed with the heavy lightly doped drain implanting process, the equivalent resistance of the polysilicon 231, and the equivalent resistance of the inverting internal node $\overline{Q}$, may be equal to the on-resistance of the first pass gate transistor PG1 that has only been performed with the basic lightly doped drain implanting process. In this case, the speed of the processor, reading data by inputting the first read current from the first read/write port 11 of the first group of read/write dual ports, will be same as that reading data by inputting the second read current from the second read/write port 12 from the first group of read/write dual ports.

In some preferred embodiments, the sum of the on-resistance of the fourth pass gate transistor PG4 that has been performed with the heavy lightly doped drain implanting process, the equivalent resistance of the polysilicon 232, and the equivalent resistance of the internal node Q, may be equal to the on-resistance of the third pass gate transistor PG3 that has only been performed with the basic lightly doped drain implanting process. In this case, the speed of the processor, reading data by inputting the third read current from the first read/write port 21 of the second group of read/write dual ports, will be same as that reading data by inputting the fourth read current from the second read/write port 22 from the second group of read/write dual ports.

Those skilled in the art may understand that the above-mentioned proposal of performing the ion implantation process in two steps is only an embodiment provided by the present invention, which is mainly used to clearly demonstrate the concept of the present invention and provide a specific proposal that is convenient for the public to implement, but is not used to limit the protection scope of the present invention.

In some more preferred embodiments, the process of performing ion implantation on the field effect transistors of the 8T DP-SRAM 10 can also be performed by two different ion implanting masks.

Figure 7A:
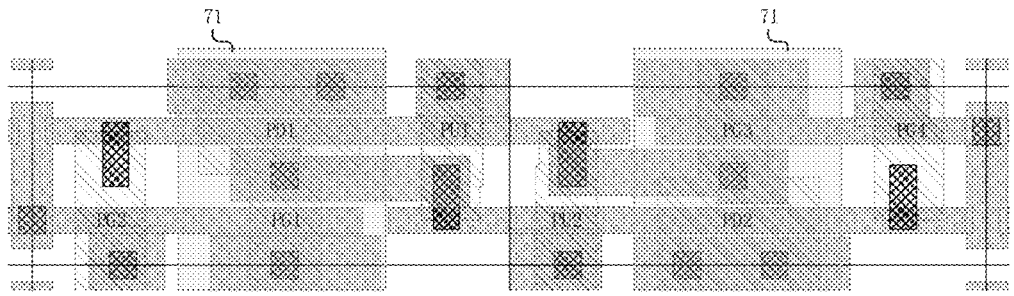
FIGS. 7A-7B show schematic diagrams of performing ion implantation according to some embodiments of the present invention.
Figure 7B:
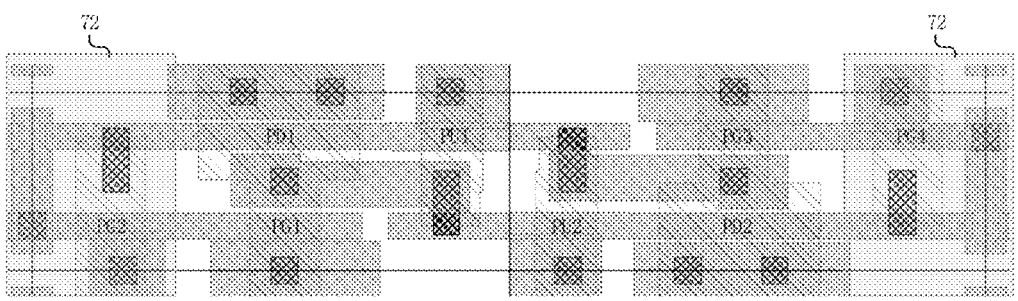

Referring to FIGS. 7A~7B, FIGS. 7A~7B show schematic diagrams of performing ion implantation according to some embodiments of the present invention.

As shown in FIG. 7A, in the above embodiment, when performing ion implantation on the field effect transistors of the 8T DP-SRAM 10, the first pass gate transistor PG1, the third pass gate transistor PG3, the first pull-down transistor PD1 and the second pull-down transistor PD2 may be covered by a first ion implanting mask 71, for performing a basic lightly doped drain implanting process and a basic pocket implanting process on the covered field effect transistors. By performing the basic lightly doped drain implanting process, the electric field in the drain region of the field effect transistors may be effectively weakened, thereby improving the hot electron degradation effect. By performing the basic pocket implantation, punch-through between the source and drain of the field effect transistors may be effectively prevented, thereby suppressing the short (narrow) channel effect.

As shown in FIG. 7B, in the above embodiment, a second ion implanting mask 72 may be also used to cover the second pass gate transistor PG2 and the fourth pass gate transistor PG4, for performing the heavy lightly doped drain implanting process and the light pocket or Halo implanting (light PKT Imp.) process on the covered second pass gate transistor PG2 and fourth pass gate transistor PG4. Compared with the further performed heavy lightly doped drain implanting process on the second pass gate transistor PG2 and the fourth pass gate transistor PG4 that have completed the basic lightly doped drain implanting process and the basic pocket implanting process, the heavy lightly doped drain implanting process and the light pocket implanting process, directly performed on the second pass gate transistor PG2 and fourth pass gate transistor PG4 that are covered by the separate second ion implanting mask 72, may further improve ion implantation conditions of the pocket implanting process, thereby reducing the degree of the pocket implanting process to further reduce the on-resistance of the second pass gate transistor PG2 and the fourth pass gate transistor PG4.

It can be understood that FIGS. 7A and 7B separately show the two ion implanting masks 71, 72 in different drawings. This is only to clearly show the areas covered by the two ion implanting masks, but not to limit that the two ion implanting masks 71, 72 must perform the ion implantations at different times. On the contrary, in some preferred embodiments, the two ion implanting masks 71, 72 may simultaneously perform different ion implanting processes on corresponding field effect transistors of the 8T DP-SRAM 10, thereby further improving the efficiency of ion implantation.

In summary, by increasing the current of the read/write ports 12, 22 with low current and slow speed, the 8T DP-SRAM 10 and the manufacturing method thereof provided by the present invention can effectively improve the reading speed of the corresponding ports.

Although the method is illustrated and described as a series of actions for the purpose of simplifying the explanation, it should be understood and appreciated that these methods are not limited by the order of the actions. Those skilled in the art may understand that some actions may occur in different orders and/or concurrently with other actions that are illustrated and described herein or that are not illustrated and described herein, in accordance with one or more embodiments.

According to another aspect of the present invention, a computer-readable storage medium is also provided herein.

The computer-readable storage medium has computer instructions stored thereon. When the computer instructions are executed by a processor, a method for manufacturing an 8T DP-SRAM, provided by any one of the above embodiments, can be implemented to compensate for the asymmetric performance of the read/write ports, which is caused by an asymmetric layout architecture of the transistors. By increasing the current of the ports 12, 22 with low current and slow speed, the speed of data reading operations of the corresponding ports 12, 22 can be effectively increased, thereby improving the performance of the corresponding ports.

Those skilled in the art will understand that information, signals and data can be represented using any of a variety of different technologies and techniques. For example, the data, instructions, commands, information, signals, bits, symbols and chips cited throughout the above description can be expressed by voltage, current, electromagnetic waves, magnetic fields or magnetic particles, light fields or optical particles, or any combination of them.

Those skilled in the art will further appreciate that the various illustrative logic blocks, modules, circuits and algorithm steps described in conjunction with the embodiments disclosed herein can be implemented as electronic hardware, computer software, or a combination of the two. In order to clearly explain the interchange ability of hardware and software, various illustrative components, blocks, modules, circuits, and steps are generally described above in terms of their functionality. Whether such functionality is implemented as hardware or software depends on the specific application and the design constraints imposed on the overall system. Technicians can implement the described functionality in different ways for each specific application, but such implementation decisions should not be interpreted as causing a departure from the scope of the present invention.

The various illustrative logic modules and circuits described in conjunction with the embodiments disclosed herein can be general-purpose processors, digital signal processors (DSP), application-specific integrated circuits (ASIC), field programmable gate arrays (FPGA) or other programmable logic devices, discrete gate or transistor logic, discrete hardware components, or any combination thereof designed to perform the functions described herein are implemented or executed. A general-purpose processor may be a microprocessor, but in the alternative, the processor may be any conventional processor, controller, microcontroller, or state machine. The processor may also be implemented as a combination of computing devices, such as a combination of a DSP and a microprocessor, multiple microprocessors, one or more microprocessors in cooperation with a DSP core, or any other such configuration.

The steps of the method or algorithm described in conjunction with the embodiments disclosed herein may be directly embodied in hardware, in a software module executed by a processor, or in a combination of the two. The software module may reside in RAM memory, flash memory, ROM memory, EPROM memory, EEPROM memory, registers, hard disk, removable disk, CD-ROM, or any other form of storage medium known in the art. An exemplary storage medium is coupled to the processor such that the processor can read information from and write information to the storage medium. In the alternative, the storage medium may be integrated into the processor. The processor and the storage medium may reside in the ASIC. The ASIC may reside in the user terminal. In the alternative, the processor and the storage medium may reside as discrete components in the user terminal.

In one or more exemplary embodiments, the functions described may be implemented in hardware, software, firmware, or any combination thereof. If implemented as a computer program product in software, each function can be stored as one or more instructions or codes on a computer-readable medium or transmitted through it. Computer-readable media includes both computer storage media and communication media, including any medium that facilitates the transfer of a computer program from one place to another. The storage medium may be any available medium that can be accessed by a computer. By way of example and not limitation, such computer-readable media may include RAM, ROM, EEPROM, CD-ROM or other optical disk storage, magnetic disk storage or other magnetic storage devices, or any other medium that can be used to carry or store desired program codes in the form of instructions or data structures and that can be accessed by a computer. Any connection is also properly called a computer-readable medium. For example, if the software is transmitted from a web site, server, or other remote source using coaxial cable, fibre optic cable, twisted pair, digital subscriber line (DSL), or wireless technology such as infrared, radio, and microwave, then the coaxial cable, fibre optic cable, twisted pair, DSL, or wireless technologies such as infrared, radio, and microwave are included in the definition of the medium. Disks and discs as used in this article include compact discs (CDs), laser discs, optical discs, digital versatile discs (DVD), floppy disks and Blu-ray discs, among which disks are often reproduced in a magnetic manner Data, and a disc optically reproduces the data with a laser. Combinations of the above should also be included in the scope of computer-readable media.

The previous description of the disclosure is provided to enable any person skilled in the art to make or use the disclosure. Various modifications to the present disclosure will be obvious to those skilled in the art, and the general principles defined herein may be applied to other variations without departing from the spirit or scope of the disclosure. Thus, the present disclosure is not intended to be limited to the examples and designs described herein, but is to be accorded the broadest scope of the principles and novel features disclosed herein.

What is claimed is:

1. An eight-transistor dual port SRAM, comprising:
   a first pass gate transistor, a drain of the first pass gate transistor is used as a first read/write port of a first group of read/write dual ports of the SRAM, and a source of the first pass gate transistor is connected to an internal node of the SRAM;
   a second pass gate transistor, a drain of the second pass gate transistor is used as a second read/write port of the first group of read/write dual ports, and a source of the second pass gate transistor is connected to an inverting internal node of the SRAM;

a third pass gate transistor, a drain of the third pass gate transistor is used as a first read/write port of a second group of read/write dual ports of the SRAM, and a source of the third pass gate transistor is connected to the inverting internal node; and a fourth pass gate transistor, a drain of the fourth pass gate transistor is used as a second read/write port of the second group of read/write dual ports, and a source of the fourth pass gate transistor is connected to the internal node of the SRAM, wherein on-resistance of the second pass gate transistor is smaller than that of the first pass gate transistor, so that a first read current flowing from the first read/write port of the first group of read/write dual ports is equal to a second read current flowing from the second read/write port of the first group of read/write dual port, on-resistance of the fourth pass gate transistor is smaller than that of the third pass gate transistor, so that a third read current flowing from the first read/write port of the second group of read/write dual ports is equal to a fourth read current flowing from the second read/write port of the second group of read/write dual port.

2. The SRAM of claim 1, wherein the first read current flows through a first end of the internal node from the first read/write port of the first group of read/write dual ports, and flows out of the SRAM from a first pull-down transistor of the SRAM to read data stored in the internal node, a gate of the first pull-down transistor is connected to the first end of the internal node, the second read current flows into a first end of the inverting internal node from the second read/write port of the first group of read/write dual ports, and flows out of the SRAM from a second end of the inverting internal node, through a second pull-down transistor of the SRAM, to read data stored in the inverting internal node, a gate of the second pull-down transistor is connected to the second end of the inverting internal node, the third read current flows through the second end of the inverting internal node from the first read/write port of the second group of read/write dual ports, and flows out of the SRAM from the second pull-down transistor to read the data stored in the inverting internal node, the fourth read current flows into a second end of the internal node from the second read/write port of the second group of read/write dual ports, and flows out of the SRAM from the first end of the internal node, through the first pull-down transistor, to read the data stored in the internal node.

3. The SRAM of claim 2, wherein the difference between the on-resistance of the first pass gate transistor and the on-resistance of the second pass gate transistor is equal to an impedance from the source of the second pass gate transistor to the second end of the inverting internal node, the difference between the on-resistance of the third pass gate transistor and the on-resistance of the fourth pass gate transistor is equal to an impedance from the source of the fourth pass gate transistor to the first end of the internal node.

4. The SRAM of claim 1, wherein the first pass gate transistor, the third pass gate transistor, a first pull-down transistor of the SRAM, and a second pull-down transistor of the SRAM are ion implanted by a basic lightly doped drain implanting process and a basic pocket implanting process, the second pass gate transistor and the fourth pass gate transistor are ion implanted by a further performed heavy lightly doped drain implanting process on basis of the basic lightly doped drain implanting process and the basic pocket implanting process.

5. The SRAM of claim 1, wherein the first pass gate transistor, the third pass gate transistor, a first pull-down transistor of the SRAM, and a second pull-down transistor of the SRAM are ion implanted by a basic lightly doped drain implanting process and a basic pocket implanting process, the second pass gate transistor and the fourth pass gate transistor are ion implanted by a heavy lightly doped drain implanting process and a light pocket implanting process.

6. A method for manufacturing an eight-transistor dual port SRAM, comprising:

generating a circuit structure of the SRAM on a substrate, wherein the circuit structure comprises:

a first pass gate transistor, a drain of the first pass gate transistor is used as a first read/write port of a first group of read/write dual ports of the SRAM, and a source of the first pass gate transistor is connected to an internal node of the SRAM;

a second pass gate transistor, a drain of the second pass gate transistor is used as a second read/write port of the first group of read/write dual ports, and a source of the second pass gate transistor is connected to an inverting internal node of the SRAM;

a third pass gate transistor, a drain of the third pass gate transistor is used as a first read/write port of a second group of read/write dual ports of the SRAM, and a source of the third pass gate transistor is connected to the inverting internal node; and a fourth pass gate transistor, a drain of the fourth pass gate transistor is used as a second read/write port of the second group of read/write dual ports, and a source of the fourth pass gate transistor is connected to the internal node of the SRAM; and performing ion implantation on the first pass gate transistor, the second pass gate transistor, the third pass gate transistor, and the fourth pass gate transistor, making on-resistance of the second pass gate transistor smaller than that of the first pass gate transistor, so that a first read current flowing from the first read/write port of the first group of read/write dual ports is equal to a second read current flowing from the second read/write port of the first group of read/write dual port, and making on-resistance of the fourth pass gate transistor smaller than that of the third pass gate transistor, so that a third read current flowing from the first read/write port of the second group of read/write dual ports is equal to a fourth read current flowing from the second read/write port of the second group of read/write dual port.

7. The method of claim 6, wherein the first read current flows through a first end of the internal node from the first read/write port of the first group of read/write dual ports, and flows out of the SRAM from a first pull-down transistor of the SRAM to read data stored in the internal node, a gate of the first pull-down transistor is connected to the first end of the internal node, the second read current flows into a first end of the inverting internal node from the second read/write port of the first group of read/write dual ports, and flows out of the SRAM from a second end of the inverting internal node, through a second pull-down transistor of the SRAM, to read data stored in the inverting internal node, a gate of the second pull-down transistor is connected to the second end of the inverting internal node, the third read current flows through the second end of the inverting internal node from the first read/write port of the second group of read/write dual ports, and flows out of the SRAM from the second pull-down transistor to read the data stored in the inverting internal node, the fourth read current flows into a second end of the internal node from the second read/write port of the second group of read/write dual ports, and flows out of the SRAM from the first end of the internal node, through the first pull-down transistor, to read the data stored in the internal node.

8. The method of claim 7, wherein the step of performing ion implantation comprises:

performing different ion implantation on the first pass gate transistor and the second pass gate transistor to make difference between the on-resistance of the first pass gate transistor and the on-resistance of the second pass gate transistor equal to an impedance from the source of the second pass gate transistor to the second end of the inverting internal node; and performing different ion implantation on the third pass gate transistor and the fourth pass gate transistor to make difference between the on-resistance of the third pass gate transistor and the on-resistance of the fourth pass gate transistor equal to an impedance from the source of the fourth pass gate transistor to the first end of the internal node.

9. The method of claim 6, wherein the step of performing ion implantation comprises:

performing a basic lightly doped drain implanting process and a basic pocket implanting process on the first pass gate transistor, the second pass gate transistor, the third pass gate transistor, the fourth pass gate transistor, a first pull-down transistor of the SRAM, and a second pull-down transistor of the SRAM; and further performing a heavy lightly doped drain implanting process on the second pass gate transistor and the fourth pass gate transistor that have been performed with the basic lightly doped drain implanting process and the basic pocket implanting process.

10. The method of claim 9, wherein the step of performing the basic lightly doped drain implanting process and the basic pocket implanting process further comprises:

covering an original implanting mask on the first pass gate transistor, the second pass gate transistor, the third pass gate transistor, the fourth pass gate transistor, the first pull-down transistor and the second pull-down transistor to perform the basic lightly doped drain implanting process and the basic pocket implanting process, the step of performing the heavy lightly doped drain implanting process further comprises:

after completing the basic lightly doped drain implanting process and the basic pocket implanting process, covering an extra implanting mask on the second pass gate transistor and the fourth pass gate transistor to perform the heavy lightly doped drain implanting process.

11. The method of claim 6, wherein the step of performing ion implantation comprises:

performing a basic lightly doped drain implanting process and a basic pocket implanting process on the first pass gate transistor, the third pass gate transistor, a first pull-down transistor of the SRAM and a second pull-down transistor of the SRAM; and performing a heavy lightly doped drain implanting process and a light pocket implanting process on the second pass gate transistor and the fourth pass gate transistor.

12. The method of claim 11, wherein the step of performing the basic lightly doped drain implanting process and the basic pocket implanting process further comprises:

covering a first implanting mask on the first pass gate transistor, the third pass gate transistor, the first pull-down transistor and the second pull-down transistor to perform the basic lightly doped drain implanting process and the basic pocket implanting process, the step of performing the heavy lightly doped drain implanting process and the light pocket implanting process further comprises:

covering a second implanting mask on the second pass gate transistor and the fourth pass gate transistor to perform the heavy lightly doped drain implanting process and the light pocket implanting process.

13. A computer-readable storage medium, having computer instructions stored thereon, wherein the manufacturing method according to claim 6 is implemented when the computer instructions are executed by a processor.

* * * * *